(12) United States Patent
Ohtsuka et al.

(10) Patent No.: US 7,782,063 B2
(45) Date of Patent: Aug. 24, 2010

(54) PARTIAL DISCHARGE CHARGE QUANTITY MEASURING METHOD AND DEVICE

(75) Inventors: Shinya Ohtsuka, Kitakyushu (JP); Masayuki Hikita, Kitakyushu (JP); Takashi Teshima, Kitakyushu (JP); Yuji Hayashi, Kitakyushu (JP)

(73) Assignee: Kyushu Institute of Technology, Fukuoka (JP)

( * ) Notice: Subject to any disclaimer, the term of this patent is extended or adjusted under 35 U.S.C. 154(b) by 288 days.

(21) Appl. No.: 11/997,215

(22) PCT Filed: Oct. 13, 2006

(86) PCT No.: PCT/JP2006/320435

§ 371 (c)(1),
(2), (4) Date: Jan. 29, 2008

(87) PCT Pub. No.: WO2007/063647

PCT Pub. Date: Jun. 7, 2007

(65) Prior Publication Data

US 2009/0146666 A1    Jun. 11, 2009

(30) Foreign Application Priority Data

Nov. 29, 2005 (JP) ............................. 2005-343246

(51) Int. Cl.
*G01R 31/08* (2006.01)
(52) U.S. Cl. ..................................... 324/536; 324/501
(58) Field of Classification Search ................. 324/536, 324/501
See application file for complete search history.

(56) References Cited

U.S. PATENT DOCUMENTS

2006/0132144 A1*  6/2006  Kato et al. ................. 324/536

FOREIGN PATENT DOCUMENTS

| JP | 2000-002742 | 1/2000 |
| JP | 2002-005985 | 1/2002 |
| JP | 2003-043094 | 2/2003 |
| JP | 2003-232828 | 8/2003 |

OTHER PUBLICATIONS

Shin'ya Otsuka et al., "Influence of GIS Tank Size on First-Incoming PD-induced Electromagnetic Wave in Terms of Risk Assessment of GIS", The Transactions of the Institute of Electrical Engineers of Japan 8, Nov. 1, 2004, No. 11, pp. 1365-1372.

Shin'ya Ohtsuka et al., "Influence of GIS Tank Size on First-incoming PD-induced Electromagnetic Wave in Terms of Risk Assessment of GIS", The Institute of Electrical Engineers of Japan Kenkyukai Shiryo, Jan. 22, 2004, Ed-04-13 to 26, DEI-04-20 to 33, HV-04-13 to 26, pp. 79 to 84.

* cited by examiner

*Primary Examiner*—Vincent Q Nguyen
(74) *Attorney, Agent, or Firm*—McGlew and Tuttle, P.C.

(57) ABSTRACT

The present invention includes an antenna for measuring an electromagnetic wave radiated from a device to be measured stemming from partial discharge and having sensitivity at least in the UHF band; a filter for extracting a TEM mode component from a measured time waveform; and a measurement device body including a processing section adapted to obtain a second order integral value of the time waveform having undergone the filter processing and obtain a discharge charge quantity from the value. The present invention also comprises an electromagnetic wave radiation simulating apparatus for inputting a pseudo discharge signal to the device to be measured and previously obtaining the relation between the second order integral value and the discharge charge quantity, the processing section obtains the discharge charge quantity from the second order integral value with reference to the previously obtained relation between the second order integral value and the discharge charge quantity.

16 Claims, 8 Drawing Sheets

FIG. 2
PROCESSING STEPS FOR OBTAINING SECOND ORDER INTEGRAL VALUE OF RADIATED ELECTROMAGNETIC WAVE WAVEFORM
(a) RADIATED ELECTROMAGNETIC WAVE WAVEFORM
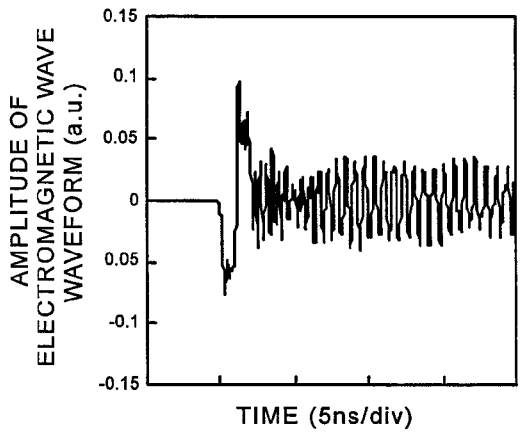
(b) EXTRACTION OF TEM MODE COMPONENT THROUGH FILTERING
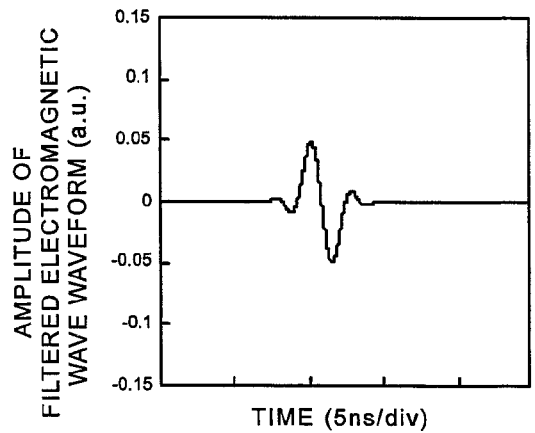
(c) FIRST ORDER INTEGRAL VALUE OF (b)
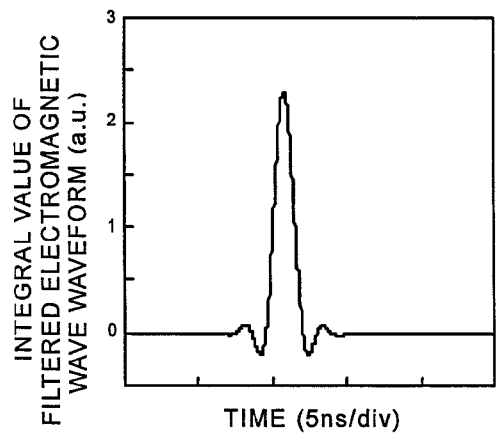
(d) SECOND ORDER INTEGRAL VALUE OF (b)
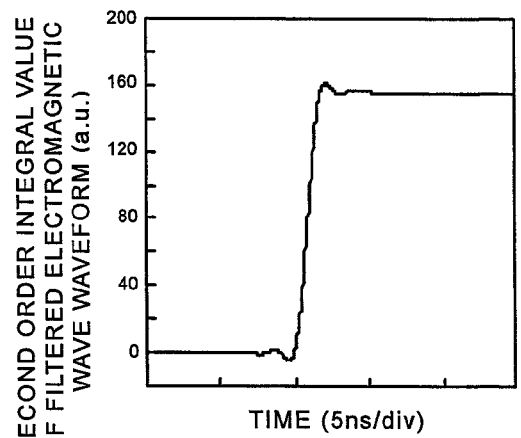

FIG. 4
SENSOR-DISTANCE DEPENDENCY OF
RADIATED ELECTROMAGNETIC WAVE WAVEFORM
(a) 66 kV-CLASS MODEL GIS
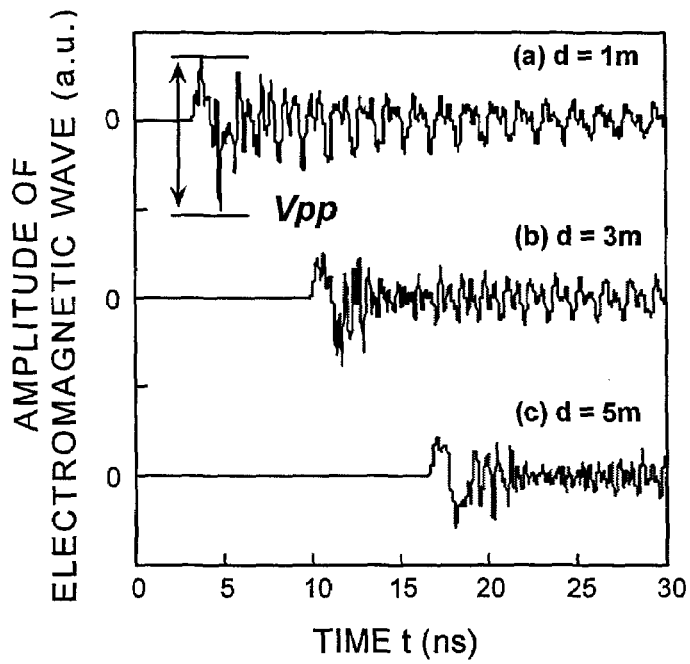
(b) UHV-CLASS MODEL GIS
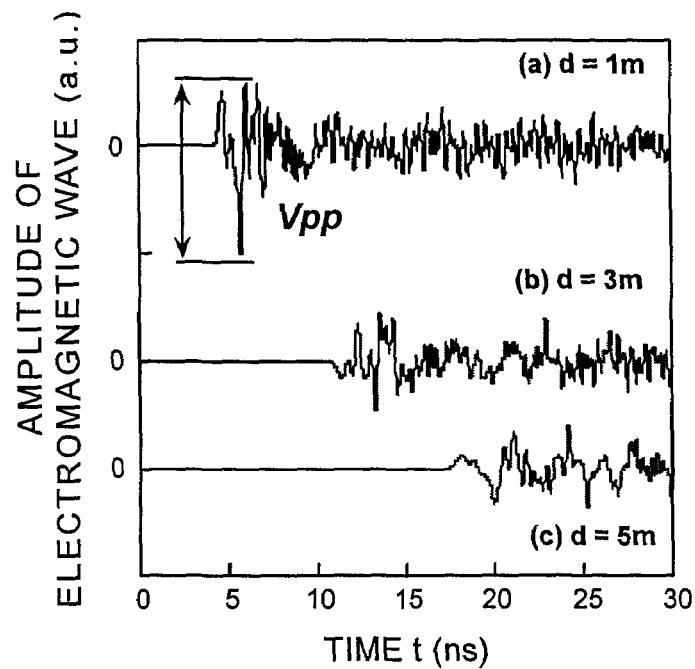

FIG. 5
DEPENDENCY OF ELECTROMAGNETIC WAVE AMPLITUDE Vpp
ON SENSOR DISTANCE AND SENSOR POSITION
(a) SENSOR POSITION : 0°
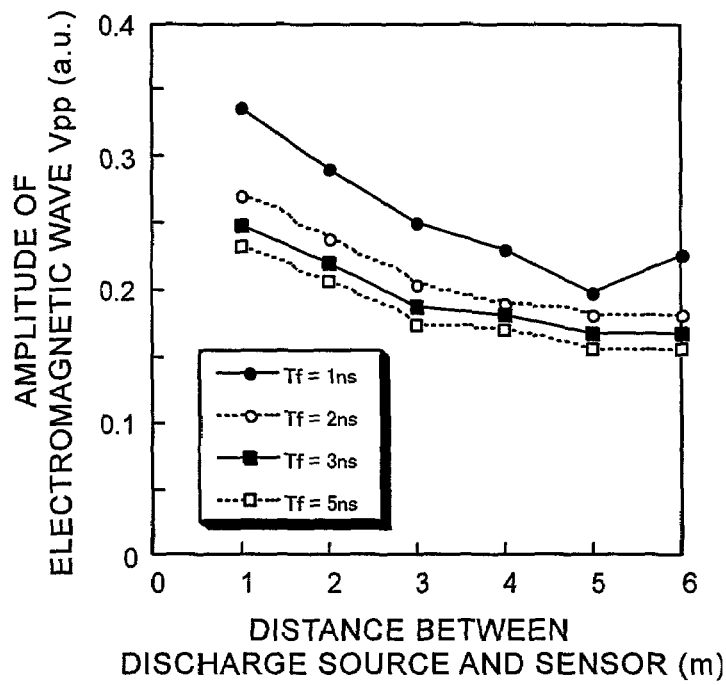
(b) SENSOR POSITION : 90°
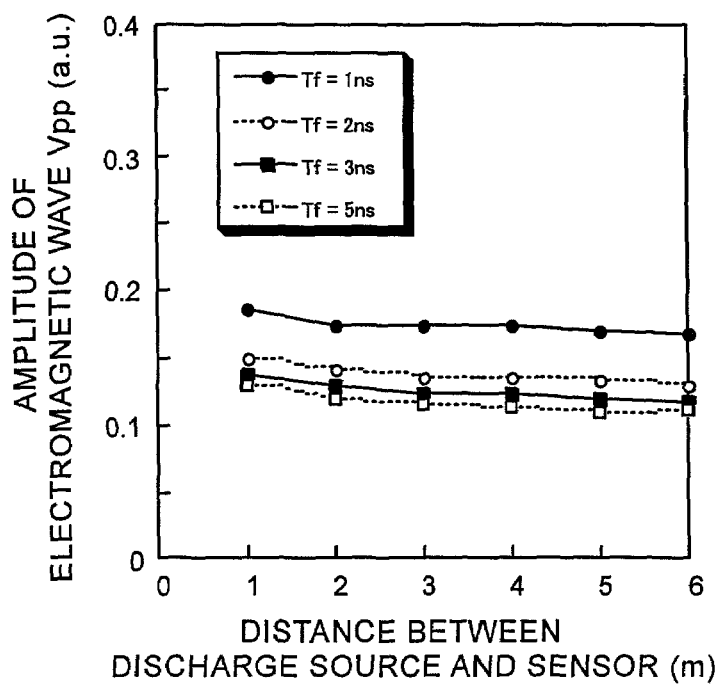

FIG. 6
RELATION BETWEEN ELECTROMAGNETIC WAVE
AMPLITUDE Vpp AND DISCHARGE CHARGE QUANTITY
(a) SENSOR POSITION : 0°
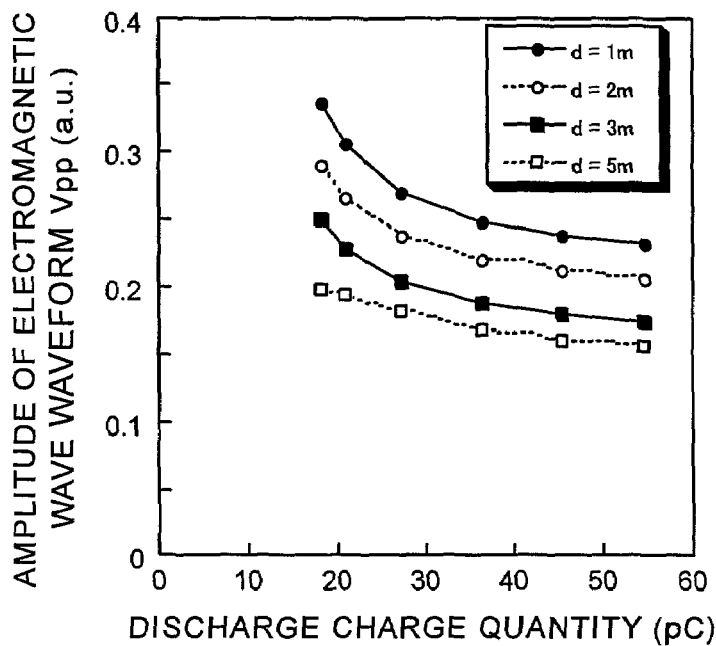
(b) SENSOR POSITION : 90°
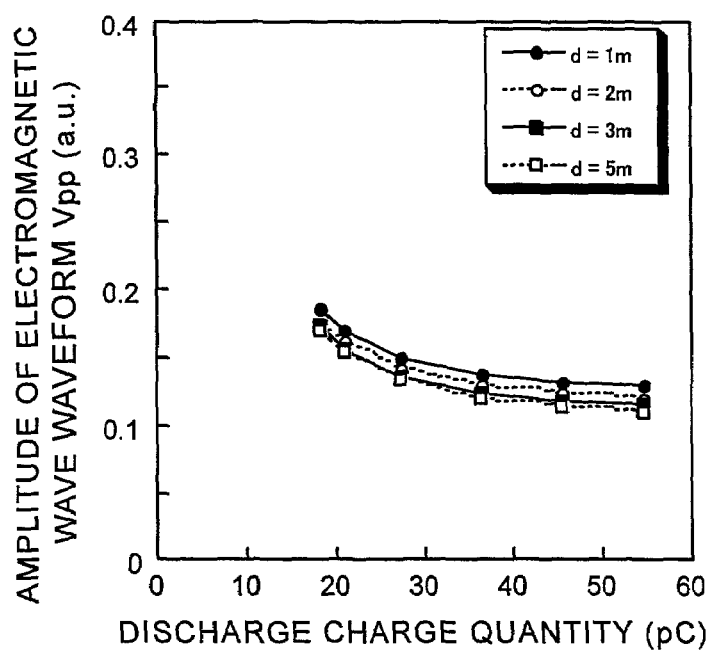

FIG. 7
RELATION BETWEEN SECOND ORDER INTEGRAL VALUE OF ELECTROMAGNETIC WAVE WAVEFORM AND DISCHARGE CHARGE QUANTITY
(a) SENSOR POSITION : 0°
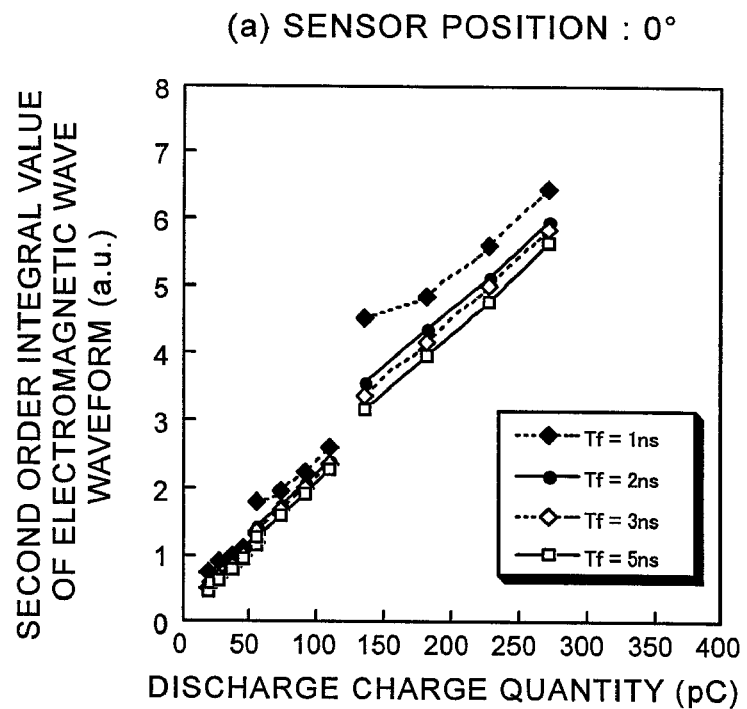
(b) SENSOR POSITION : 90°
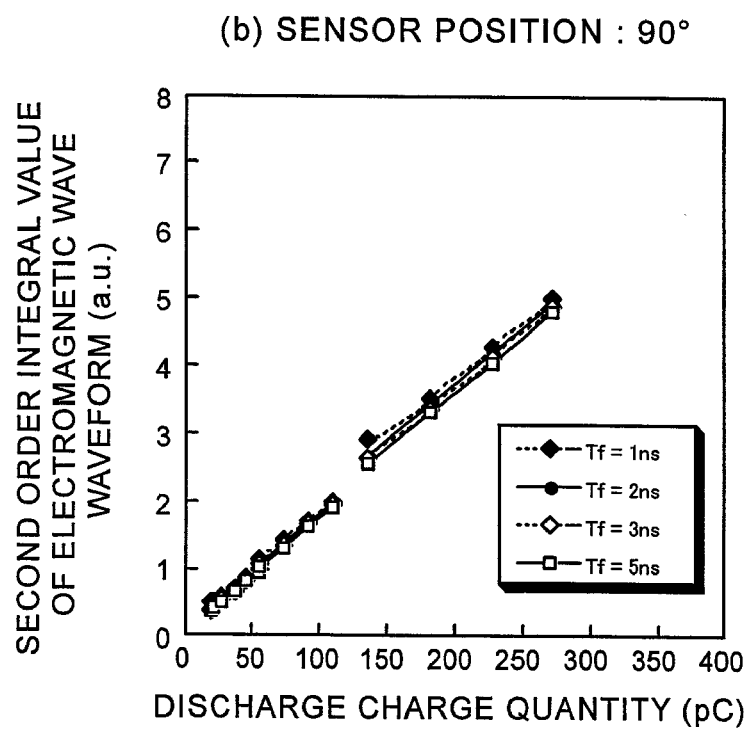

RELATION BETWEEN DISCHARGE CHARGE QUANTITY AND
SECOND ORDER INTEGRAL VALUE OF TEM MODE COMPONENT

RELATION BETWEEN DISCHARGE CHARGE QUANTITY AND
SECOND ORDER INTEGRAL VALUE OF TEM MODE COMPONENT
FOR DIFFERENT ADHERING POSITIONS OF FOREIGN OBJECT
SERVING AS DISCHARGE SOURCE

PARTIAL DISCHARGE CHARGE QUANTITY MEASURING METHOD AND DEVICE

TECHNICAL FIELD

The present invention relates to a method and device for measuring a partial discharge charge quantity irrespective of sensor position, in which a TEM mode is extracted from a time waveform of an electromagnetic wave signal mainly in the UHF band, which is radiated due to partial discharge, and the partial discharge charge quantity is determined on the basis of a second order integral value of the TEM mode.

BACKGROUND ART

Insulation diagnosis for gas insulated switching devices (GIS) and transformers has been conducted through measurement of electromagnetic waves radiated due to partial discharge. Since this electromagnetic wave measurement is mainly performed in the UHF band, it is generally called a UHF method. In general, in a gas insulated device such as a gas insulated switching device or a gas insulated power transmission line (GIL), the space between a center high-voltage conductor and a metal grounding tank is exposed to a strong electric field. Therefore, if partial discharge occurs in the interior of the device, eventually, the insulation between the center conductor and the metal tank may be broken, which may result in dielectric breakdown. Therefore, there has been employed a diagnosis method in which, at the stage of partial discharge, which is a sign of dielectric breakdown, an electromagnetic wave signal propagating through the interior of a gas insulated device is detected, and determination is made as to whether the detected signal is a partial discharge signal, to thereby determine an insulation anomaly in advance. Although various methods have been proposed for detection of such a partial discharge signal, a UHF (Ultra High Frequency) method is considered to be useful for enhancing the reliability of insulation diagnosis. In the UHF method, high-frequency electromagnetic waves mainly in the UHF band (300 MHz to 3 GHz) are detected by use of an antenna having sensitivity in this band. Since the UHF method allows for measurement of partial discharge signal with high sensitivity, application of the UHF method is presently studied for a wide range of applications and for use as a measurement method for asset management of devices.

Meanwhile, presently, for measurement of partial discharge in a shipment test for gas insulated switching devices (GIS), there is a standardized method for calibrating charge quantity on the basis of a low-frequency component in a k-Hz band (IEC60270, JEC0401-1990; partial discharge measurements). IEC60270 prescribes a conventionally performed standard partial discharge measurement method in which a partial discharge pulse is detected in synchronism with the phase of AC high voltage. A plant test for gas insulated switching devices is performed on the basis of this test method. Further, consideration is given to application of the UHF method to insulation diagnosis for devices which are being operated at a local substation or the like, and moves have been made toward standardizing a charge quantity calibration method based on the UHF method. Calibration of discharge charge quantity is the most important item for insulation diagnosis, and in CIGRE TF15/33.03.05, it is stated that for early anomaly detection of a GIS monitor system, it is necessary to demonstrate a detection sensitivity corresponding to a discharge charge quantity of 5 pC throughout a GIS (CIGRE TF15/33.03.05: "PD detection system for GIS: sensitivity verification for the UHF method and the acoustic method", Electra, No. 18, pp. 75-87, 1999). As described above, establishment of a discharge charge quantity calibration method based on the UHF method has been demanded for insulation diagnosis at a local substation and a partial discharge test for shipment at a plant.

However, heretofore, the relation between discharge charge quantity and the waveform of an electromagnetic wave measured by the UHF method has not been known. Although the correlation with the energy, amplitude, etc. of the waveform has been studied, linearity has not been observed, and no theoretical evidence exists.

Patent Document 1: Japanese Patent Application Laid-Open (kokai) No. 2003-43094
Patent Document 2: Japanese Patent Application Laid-Open (kokai) No. 2003-232828
Patent Document 3: Japanese Patent Application Laid-Open (kokai) No. 2002-5985

DISCLOSURE OF THE INVENTION

Problems to be Solved by the Invention

The relation between discharge charge quantity and radiated electromagnetic wave is such that although the charge quantity is equal to the result of integration of discharge current with respect to time, the amplitude of the radiated electromagnetic wave is proportional to a change in the discharge current with time. Therefore, the discharge charge quantity is proportional to the second order integral value of the waveform of the radiated electromagnetic wave. However, an electromagnetic wave propagating through a closed space excites a TE mode and a TM mode, and their characteristics are superposed. Therefore, an electromagnetic wave signal depending on the discharge charge quantity is limited to a TEM mode component which does not contain these modes.

An object of the present invention is to provide a method and apparatus for measuring partial discharge charge quantity which can be used as an insulation diagnosis technique or a charge quantity calibration method, based on the UHF method replacing the method of IEC60270, and in which a component lower than the cutoff frequency of a TE11 mode, which is the lowest-order electromagnetic wave propagation mode, is extracted from a measured electromagnetic wave signal through filtering processing to thereby obtain a TEM mode component, and a discharge charge quantity is obtained on the basis of a value obtained through second order integration of the TEM mode component.

Means for Solving the Problems

A partial discharge charge quantity measurement method of the present invention comprises measuring an electromagnetic wave radiated from a device to be measured stemming from partial discharge, by use of an antenna having sensitivity at least in the UHF band; extracting a TEM mode component from a measured time waveform by use of a filter; obtaining a second order integral value of the time waveform having undergone the filter processing; and obtaining a discharge charge quantity from the value. The method may further comprise inputting a pseudo discharge signal to the device to be measured and previously obtaining the relation between the second order integral value and the discharge charge quantity; and obtaining the discharge charge quantity from the second order integral value with reference to the previously obtained relation between the second order integral value and the discharge charge quantity.

A partial discharge charge quantity measurement device of the present invention comprises an antenna adapted to measure an electromagnetic wave radiated from a device to be measured stemming from partial discharge and having sensitivity at least in the UHF band; a filter for extracting a TEM mode component from a measured time waveform; and a measurement device body including a processing section adapted to obtain a second order integral value of the time waveform having undergone the filter processing and obtain a discharge charge quantity from the value. The apparatus may further comprise an electromagnetic wave radiation simulating apparatus for inputting a pseudo discharge signal to the device to be measured and previously obtaining the relation between the second order integral value and the discharge charge quantity, wherein the processing section obtains the discharge charge quantity from the second order integral value with reference to the previously obtained relation between the second order integral value and the discharge charge quantity.

The present invention reveals the relation between the discharge charge quantity and the waveform of the electromagnetic wave measured by the UHF method, which relation has remained unknown despite several attempts. Notably, since the present method is based on a physical phenomenon, it is a theoretically correct method.

By virtue of the method of the present invention, the discharge charge quantity can be calibrated by use of the UHF method, irrespective of the distance between a discharge source and a sensor and the position of the sensor in the circumferential direction (direction of q). The principle of the method will now be described with reference to FIG. 2. FIG. 2 is a set of graphs for explaining the steps for filtering the waveform of a radiated electromagnetic wave and obtaining a second order integral value.

FIG. 2(a) shows the waveform of an electromagnetic wave radiated stemming from partial discharge. The waveform of this electromagnetic wave is composed of a TEM mode, which has a correlation with discharge current, and TE and TM modes induced during propagation of the electromagnetic wave within a GIS. As is well known, the TE mode is a propagation mode in which the electric field vector is perpendicular to the propagation direction of the wave (the electric field vector is transverse wave: Transverse Electric) and does not have a component in the propagation direction. In other words, the TE mode is a propagation mode of an electromagnetic wave in which the magnetic field vector has a component in the propagation direction. The TM mode is a propagation mode in which the magnetic field vector is perpendicular to the propagation direction of the wave (the vibration of the magnetic field vector is transverse wave: Transverse Magnetic) and does not have a component in the propagation direction. In other words, the TM mode is a propagation mode of an electromagnetic wave in which the electric field vector has a component in the propagation direction. The TEM mode (Transverse Electromagnetic Mode) is a complete transversal wave transmission mode in which neither an electric field component nor a magnetic field component is present in the propagation direction of an electromagnetic wave, and an electric field and a magnetic field are present only in planes perpendicular to the propagation direction. Since the propagation velocities of the TE and TM modes have dispersing characteristics with respect to frequency components, the waveform of a measured radiated electromagnetic wave changes depending on the distance between a discharge source and a sensor and the mount position of the sensor on the tank in the circumferential direction (direction of q). The amplitude of the TEM mode component of the radiated electromagnetic wave is proportional to a change in discharge current with time.

FIG. 2(b) shows the TEM mode component extracted through filtering processing; FIG. 2(c) shows a first order integral value thereof, and FIG. 2(d) shows a second order integral value thereof. The second order integral value of a time waveform composed of the TEM mode component extracted through removal of the TE and TM mode components from the waveform of the measured radiated electromagnetic wave is proportional to a value obtained through integration of the time waveform of discharge current (radiation source); i.e., the discharge charge quantity. Therefore, theoretically, the discharge charge quantity can be obtained through the steps of extracting the TEM mode component from the waveform of an electromagnetic wave detected within a GIS, and obtaining a second order integral value of its time waveform.

Notably, there may exist differences among electromagnetic wave measurement systems, such as characteristics of a detection sensor, presence/absence of an amplifier, and the gain characteristic of the amplifier. Therefore, even when the same discharge occurs, the amplitude of the waveform of the detected electromagnetic wave may vary among the electromagnetic wave measurement systems. Further, even in the case where the same discharge is measured by the same electromagnetic wave measurement system, if the size of the GIS tank (that is, the voltage class) changes, the amplitude of the waveform of the detected electromagnetic wave may vary. Therefore, before the present device is operated, a pseudo discharge signal is input to a GIS to be monitored, and the relation between the discharge charge quantity and the second order integral value of the TEM mode component of the waveform of the measured radiated electromagnetic wave is obtained in advance (a calibration curve is made such that the second order integral value can be handled as an absolute value).

EFFECTS OF THE INVENTION

According to the present invention, calibration of the discharge charge quantity obtained by the UHF method becomes possible, and the method and device of the present invention can be used for a shipment test for partial discharge of gas insulated switching devices GIS. Further, when the method and device of the present invention are applied to insulation anomaly diagnosis for a GIS existing at a local substation, the discharge charge quantity can be known from insulation diagnosis based on the UHF method.

BRIEF DESCRIPTION OF DRAWINGS

FIG. 2 is a set of graphs for explaining the steps of filtering the waveform of a radiated electromagnetic wave and obtaining a second order integral value.

FIG. 4(a) is a graph showing an example sensor-distance dependency of the waveform of an electromagnetic wave radiated due to a partial discharge in a 66 kV-class model GIS; and FIG. 4(b) is a graph showing an example sensor-distance dependency of the waveform of an electromagnetic wave radiated due to a partial discharge in a UHV-class model GIS.

FIG. 5 is a set of graphs showing the relation between radiated electromagnetic wave amplitude Vpp and sensor distance from a discharge source for different sensor positions.

FIG. 6 is a set of graphs showing the relation between electromagnetic wave amplitude Vpp and discharge charge quantity for different sensor positions.

FIG. 7 is a set of graphs showing the relation between the second order integral value of unfiltered electromagnetic wave waveform and discharge charge quantity for different sensor positions.

DESCRIPTION OF REFERENCE NUMERALS

Figure 1:
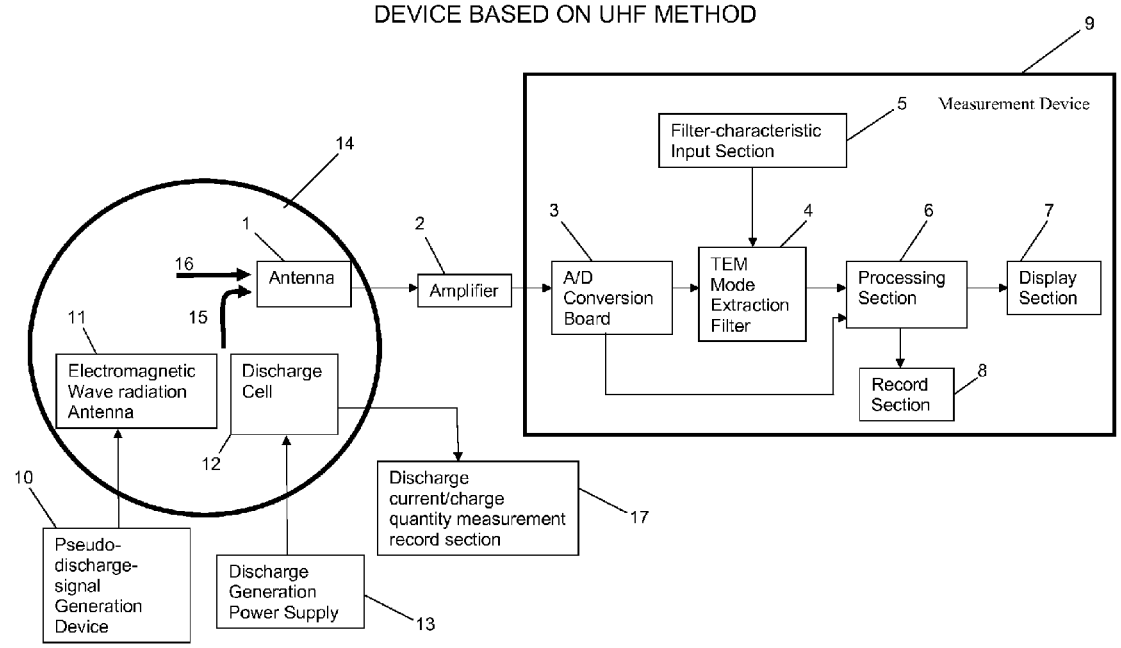
FIG. 1 is a diagram schematically showing the structure of a UHF-method-based charge quantity measurement device to which the present invention can be applied.

1: antenna
2: amplifier
3: A/D conversion board
4: TEM mode extraction filter
5: filter-characteristic input section
6: processing section
7: display section
8: record section
9: measurement device body (measurement device)
10: pseudo-discharge-signal generation device
11: electromagnetic wave radiation antenna
12: discharge cell
13: discharge generation power supply
14: device to be measured
15: pseudo discharge electromagnetic wave signal
16: discharge electromagnetic wave signal
17: discharge current/charge quantity measurement record section

BEST MODES FOR CARRYING OUT THE INVENTION

The present invention will now be described by way of examples. FIG. 1 illustrates the general structure of a UHF-method-based charge quantity measurement device to which the present invention can be applied. The illustrated charge quantity measurement device performs charge quantity calibration for converting a measured discharge electromagnetic wave signal to a charge quantity, and outputs (displays) the calibrated charge quantity. A to-be-measured device 14 in FIG. 1 is a gas insulted switching device (GIS) or a gas insulated power transmission line for which calibration of discharge charge quantity or insulation anomaly diagnosis is performed. For example, the gas insulated switching device (GIS) may be a bus line, a breaker, a disconnector, a grounding switch, or an arrester. The basic structure of its single-phase bus line portion assumes a coaxial cylindrical shape, and is composed of a center high voltage conductor, and a grounding tank covering the circumference thereof. The insulation between the center conductor and the grounding tank is realized by means of an insulating medium gas charged into the tank and an insulating spacer which supports and insulates the center conductor.

An antenna (sensor) 1 having sensitivity from at least the VHF band and mainly in the UHF band measures a discharge electromagnetic wave signal 16 (partial discharge radiated electromagnetic wave). This discharge electromagnetic wave signal 16 is amplified by an amplifier 2, so that the measured time waveform is amplified. The resultant analog signal is converted to a digital signal by an A/D conversion board 3, and a TEM mode component is extracted from the digital signal by use of a TEM mode extraction filter 4. A filter-characteristic input section 5 inputs the filter characteristic of the TEM mode extraction filter 4 in consideration of the cutoff frequencies of the TE and TM modes, which change depending on the device to be measured. The TEM mode extraction filter 4 extracts a component equal to or lower than the cutoff frequency of the lowest-order electromagnetic wave propagation mode. For example, in the case of a gas insulated switching device, there is extracted a frequency component equal to or lower than the cutoff frequency of the TE11 mode, which is determined from the dimensions of a tank container and a high voltage conductor provided therein. Thus, it becomes possible to calibrate discharge charge quantity irrespective of the distance between a discharge source and the sensor (antenna) and the mounting position of the sensor in the circumferential direction.

The present measurement device can use the waveform of an electromagnetic wave measured by means of a digital oscilloscope via the amplifier 2. In this case, the waveform of the measured electromagnetic wave is passed through the TEM mode extraction filter 4, and the discharge charge quantity is evaluated at a processing section 6. Further, in the case where the radiated electromagnetic wave is measured at a distance at which superposition of the TE mode on the TEM mode due to its propagation velocity dispersion characteristic does not occur, the filtering processing becomes unnecessary.

The processing section 6 obtains a second order integral value of the time waveform having undergone the filtering processing, and obtains the discharge charge quantity from the value. A display section 7 and a record section 8 respectively displays and records the obtained discharge charge quantity. The present device also can display and record the raw waveform of the electromagnetic wave which is not passed through the TEM mode extraction filter 4 and which contains the TE and TM modes. Further, the processing section 6 can evaluate the type, position, and state of the discharge source, if a corresponding algorithm is provided in the processing section 6.

The time range in which second order integration is performed is desirably determined to be equal to the time period of the time waveform of current change associated with a discharge phenomenon which serves as a radiation electromagnetic wave source, or longer than the time period of the time waveform; for example, in a range between the time period of the time waveform and five times the time period. The second order integral value may be the final value at the end the integration period, or a substantially constant second order integral value as measured after having first changed greatly within the integration period. Typical time ranges corresponding to gaseous discharge, in-void discharge, surface discharge, etc. are set as integration ranges. For each case, the second order integral value can be obtained, and the discharge source can be readily specified by viewing a change in the second order integral value within the corresponding set time. In the case where time-frequency analysis of the time waveform through wavelet transformation reveals that the influence of reflection waves is strong, the reflection component is removed through filtering processing, and a second order integral value is then obtained, whereby a discharge charge quantity can be accurately obtained, while the influence of the reflection waves is eliminated.

The illustrated charge quantity measurement device includes an electromagnetic wave radiation simulating apparatus for obtaining, in advance, the relation (calibration curve) between the second order integral value and the discharge charge quantity for a device to be measured, by use of the present measurement device. This electromagnetic wave radiation simulating apparatus includes a pseudo radiation signal generation apparatus 10 for generating a pseudo discharge signal in accordance with an arbitrarily set charge quantity; and an electromagnetic wave radiation antenna 11 for generating a pseudo discharge electromagnetic wave signal 15 on the basis of the generated pseudo discharge signal. The generated pseudo discharge electromagnetic wave signal 15 is measured by use the above-described antenna 1.

Alternatively, the electromagnetic wave radiation simulating apparatus may be composed of a discharge cell 12 formed of a small sealed container and generating a real discharge; a discharge generation power supply 13 for applying voltage thereto; and a discharge current/charge quantity measurement record section 17 which measures a discharge current within the discharge cell 12, obtains a charge quantity from its time integral value, and records it together with the current waveform. On the basis of the charge quantity obtained by the discharge current/charge quantity measurement record section, the relation between the second order integral value and the discharge charge quantity can be obtained by use of the present measurement device. An arbitrary gas (e.g., SF6 gas or $CO_2$ gas) or air is charged in the sealed container of the discharge cell 12 under a pressure equal to or lower than 10 atm. The discharge cell 12 includes electrodes for creating a non-uniform electric field for simulating a partial discharge within the gas. In the case where in-void discharge, surface discharge, or discharge from a free foreign object is simulated, a solid insulator including a void, a void-free solid insulator carrying a metal foreign object attached to a portion of the surface thereof, or a free foreign object is inserted between the electrodes, whereby a partial discharge can be generated.

The processing section 6 of the measurement device body 9 uses the relation (calibration curve) between the second order integral value and the discharge charge quantity, which is obtained by use of the electromagnetic wave radiation simulating apparatus before the measurement device is actually operated. Such a calibration curve is obtained for various states, such as a state in which a radiated electromagnetic wave is caused to pass through a spacer, and a state in which the radiated electromagnetic wave is caused to pass through a bent portion or a branch portion. The thus obtained calibration curves are used as needed, for example, when detailed evaluation is necessary or when passage through a spacer or passage through a branch portion is confirmed through separate determination of the position of a discharge source. Diagnosis regarding a discharge generation source, position determination, and insulation anomaly state can be performed, through incorporation, into the processing section 6 of the measurement device body 9, an algorithm for evaluating the discharge source, the discharge position, and the discharge state.

Figure 3:
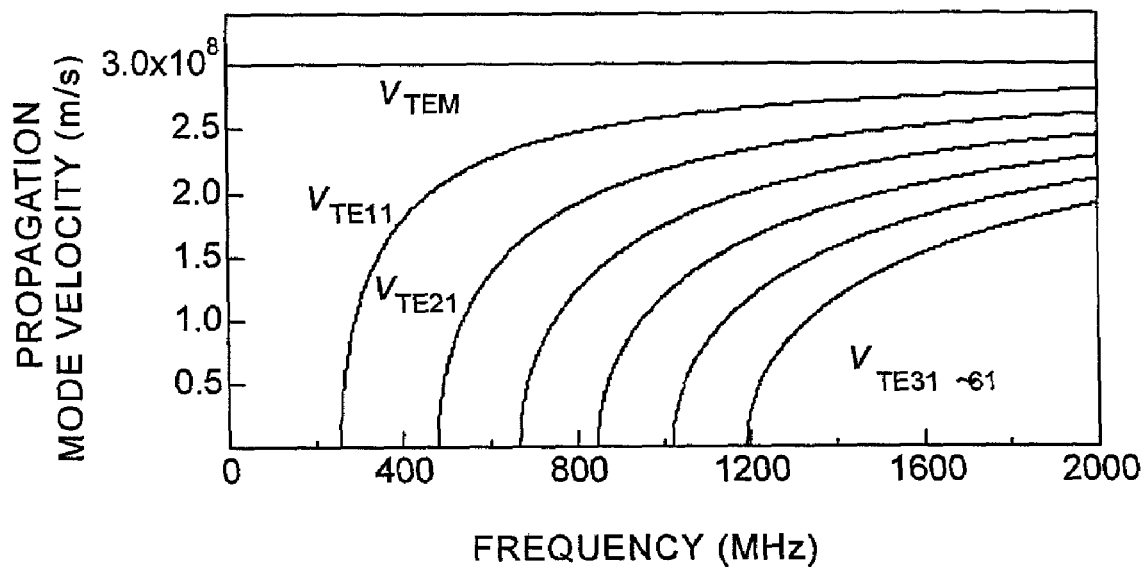
FIG. 3 is a graph showing the propagation velocity of a TE mode.

The waveform of the measured electromagnetic wave is influenced by a TEM mode component stemming from discharge and depending on the discharge current, and other modes, such as TE and TM modes, when the electromagnetic wave propagates through the interior of a sealed container such as a gas insulated switching device. Since each of the TE and TM modes has a velocity dispersion property which depends on the frequency (see FIG. 3 and Equation (1)), the mode components superposed on the TEM mode change with the distance between the discharge source and the sensor, and thus, the shape of the waveform changes with the distance between the discharge source and the sensor. Further, since the state of excitation of the TE and TM modes in the circumferential direction of the tank changes depending on the orders thereof, the shape of the waveform also changes depending on the mounting position of the sensor in the circumferential direction of the tank.

$$v = c(1-(fc/f)^2)^{0.5} \qquad \text{Eq. (1)}$$

where v: propagation velocity; c: velocity of light; fc: cutoff frequency; f: frequency.

Further, the respective cutoff frequencies of the TE and TM modes change depending on the size of the sealed container as well. Therefore, when different GISs of different sizes (in particular, different voltage classes) are measured, the measured electromagnetic waves assume different waveforms even when the distance between the discharge source and the sensor is fixed or constant. Moreover, when the configuration of the measurement device, such as a measurement sensor to be used, and the gain of an amplifier to be used, is changed, the waveform of the measured electromagnetic wave changes. For example, in the case where the measurement device is configured such that the sensor has high sensitivity and the amplifier has a large gain, the amplitude of the waveform of the measured electromagnetic wave becomes large, and the second order integral value of the TEM mode component obtained in accordance with the method of the present invention becomes larger for the same discharge phenomenon.

In view of the above, when the present invention is applied to a GIS which is to be measured or for which a shipment test is performed, it is necessary to obtain, in advance, the relation (calibration curve) between the discharge charge quantity and the second order integral value of the time waveform of the TEM mode component in a device to be measured, by use of a measurement device to be used for actual measurement. Notably, in the case where a charge quantity measurement device having the same characteristic is used for a GIS of the same type, a calibration curve obtained in the past can be used, and a new calibration curve is not required to be obtained. Further, in the case where the absolute value of the charge quantity is not needed and only a relative change in the value is observed, the advance obtainment of the calibration curve is unnecessary, and the only requirement is observation of a change in the measured second order integral value.

Since the calibration of the charge quantity is performed on the basis of the TEM mode component, the present method can be applied even when a branch portion or a bent portion is present. However, in the case where more accurate calibration which takes into consideration the structure of a GIS, the spacer passage characteristics and the influence of the branched portion or the bent portion are calibrated in advance. Thus, accurate evaluation can be performed even in such a case.

EXAMPLES

FIG. 4(a) is a graph showing an example sensor-distance dependency of the waveform of an electromagnetic wave radiated due to a partial discharge in a 66 kV-class model GIS; and FIG. 4(b) is a graph showing an example sensor-distance dependency of the waveform of an electromagnetic wave radiated due to a partial discharge in a UHV-class model GIS. Even when the same partial discharge occurs, if the sensor distance d changes, the shape of the waveform of the radiated electromagnetic wave changes, and the maximum amplitude (the maximum difference between the positive and negative peaks) Vpp changes. Further, as shown in FIG. 4(b), even when the same discharge as in FIG. 4(a) occurs and the distance between the discharge source and the sensor is the same, the amplitude Vpp change depending on the size of the GIS tank. In addition to sensor distance dependency, sensor-mounting position dependency is observed. That is, due to the electromagnetic wave propagation mode characteristics, the measured waveform assumes different shapes and sizes depending on whether the attachment angle q of the sensor is 0 degree or 90 degrees, where the angle q is a counterclockwise angle of the sensor attachment position with a line extending perpendicular to a high voltage conductor and passing through a discharge source used as a reference. For example, when q is 90 degrees, an odd order TE mode does not appear.

Moreover, in the case where the type of the sensor, the gain of the amplifier, or the like is changed, even when the measurement is performed at the same position for the same discharge, the amplitude of the waveform of a radiated electromagnetic wave changes. Therefore, the absolute value of the second order integral value is influenced by the type of the sensor, the gain of the amplifier, or the like. Therefore, it is necessary to obtain, in advance, the relation (calibration curve) between the second order integral value and the discharge charge quantity for each measurement device to be used, and for each device to be measured.

FIGS. 5(a) and 5(b) show the relation between radiated electromagnetic wave amplitude Vpp and sensor distance from a discharge source for different sensor positions (0 degree and 90 degrees). Tf represents the falling time of the time waveform of a discharge current, and the rising time Tr is the same for all cases. As can be seen from FIGS. 5(a) and 5(b), when the sensor position or the sensor distance changes, Vpp changes for the same discharge. Further, when the waveform of the discharge current (in this case, the falling time Tf) changes, Vpp also changes.

FIGS. 6(a) and 6(b) show the relation between electromagnetic wave amplitude Vpp and discharge charge quantity for different sensor positions (0 degree and 90 degrees). As can be seen from FIGS. 6(a) and 6(b), no linear relation is present between discharge charge quantity and Vpp. Further, for discharge of the same charge quantity, Vpp changes if the sensor distance changes.

As can be understood from the above, for charge quantity calibration based on a radiated electromagnetic wave measured by the UHF method, it is necessary to take into account the waveform of discharge current, the distance between a discharge source and the sensor, and the circumferential position of the sensor, and theoretically, evaluation cannot be performed on the basis of the amplitude Vpp of the waveform.

This is because the waveform of the electromagnetic wave is influenced by not only a component depending on discharge current, but also TE and TM modes, since the electromagnetic wave propagates through a closed space. Since the propagation velocities of these mode components have frequency dependency; i.e., velocity dispersing property, the degree of their influences change depending on the sensor position and the sensor distance. Therefore, it is necessary to extract an electromagnetic wave component (TEM mode component) depending on discharge current, while eliminating the TE and TM modes.

There is a relation between a discharge current and the waveform of a corresponding electromagnetic wave such that the amplitude of the waveform of the electromagnetic wave is proportional to a change in the discharge current with time. Therefore, the second order integral value of the waveform of the electromagnetic wave which is composed of the TEM mode component with the TE and TM mode components removed is proportional to the charge quantity obtained through integration of the current waveform. The present invention proposes a method and device for measuring charge quantity by use of the UHF method and the above-described relation.

FIGS. 7(a) and 7(b) show the relation between the second order integral value of unfiltered electromagnetic wave waveform and discharge charge quantity for different sensor positions (0 degree and 90 degrees). As can be seen from these drawings, in the case shown in FIG. 7(b) in which the sensor position is 90 degrees, odd order modes, such as a TE11 mode, do not appear, so that the influence of the modes decreases accordingly, and a better proportional relation is observed between the second order integral value and the discharge charge quantity, as compared with the case shown in FIG. 7(a). However, a slight variation is observed among different discharge current waveforms. This demonstrates the necessity of extracting the TEM mode component through filtering and integrating its waveform two times (second order integration).

Figure 8:
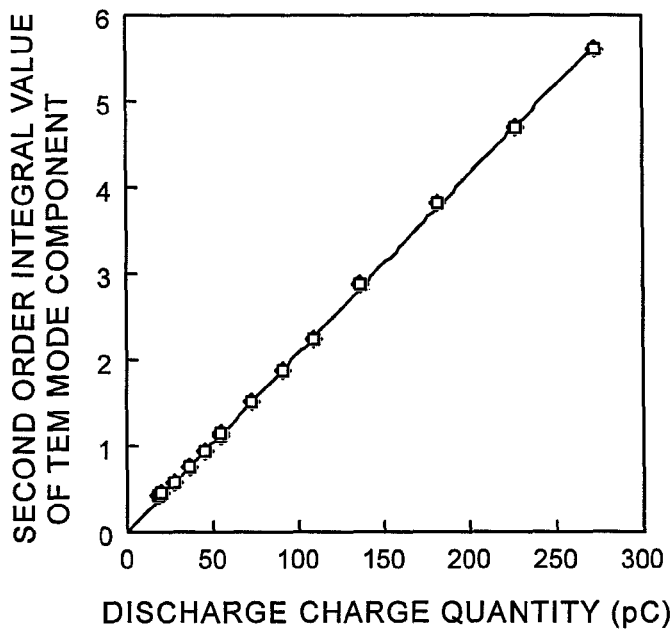
FIG. 8 is a graph showing the relation between the second order integral value of a TEM mode component and discharge charge quantity.

FIG. 8 is a graph showing the relation between the second order integral value of the TEM mode component and discharge charge quantity. A calibration curve as shown in this drawing is measured for a device to be measured. Thus, it becomes possible to know the discharge charge quantity from a partial discharge radiated electromagnetic wave measured by the UHF method.

Figure 9:
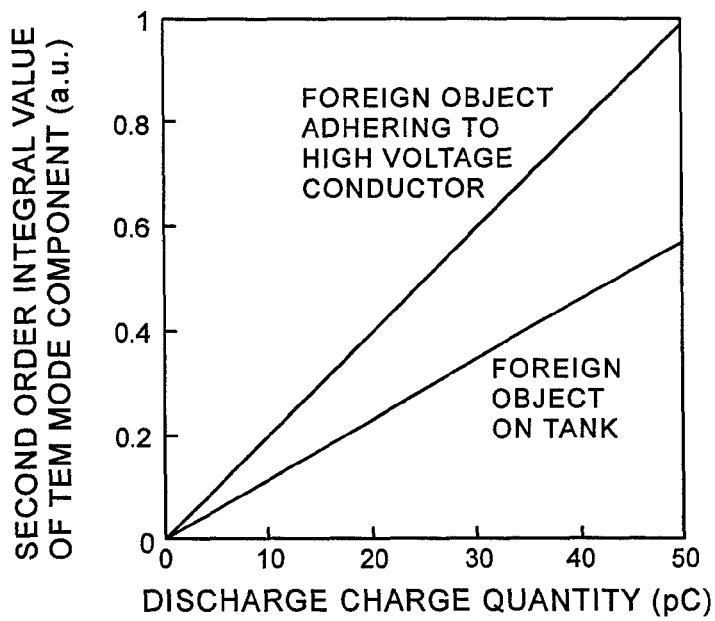
FIG. 9 is a graph showing the relation between discharge charge quantity and the second order integral value of a TEM mode component for different adhering positions of a foreign object serving as a discharge source.

FIG. 9 is a graph showing the relation between discharge charge quantity and the second order integral value of a TEM mode component for different adhering positions of a foreign object serving as a discharge source. As can be seen from this graph, the second order integral value of the TEM mode component changes depending on whether a foreign object adheres on a high voltage conductor or stands on a tank. Therefore, it is necessary to taken into consideration the influence of the adhering position of the foreign object, and to obtain, in advance, the relation (calibration curve) between the second order integral value and the adhering or standing position. The adhering position of the foreign object can be determined on the basis of a change in the waveform of an electromagnetic wave with time, in accordance with the method of a prior application (Japanese Patent Application No. 2005-305889). However, even when the adhering position is unknown, evaluation can be performed on a safer side. That is, when the present method is applied to a shipment test (partial discharge test) or insulation diagnosis of a device which is being operated, a characteristic for a foreign object standing on the tank, which characteristic gives a larger charge quantity for the same second order integral value, is used. Thus, it is possible to prevent underestimation of the charge quantity. Notably, for a free foreign object, basically, appropriate evaluation can be performed through use of the characteristic for a foreign object standing on the tank.

The invention claimed is:

1. A partial discharge charge quantity measurement method comprising the steps of:
    measuring an electromagnetic wave radiated from a device to be measured stemming from partial discharge, by use of an antenna having sensitivity from at least the VHF band and mainly in the UHF band;
    extracting a TEM mode component from a measured time waveform by use of a filter;
    obtaining a second order integral value of the time waveform having undergone the filter processing;

obtaining a discharge charge quantity from the obtained second order integral value;

inputting a pseudo discharge signal to the device to be measured and previously obtaining the relation between the second order integral value and the discharge charge quantity; and obtaining the discharge charge quantity from the second order integral value with reference to the previously obtained relation between the second order integral value and the discharge charge quantity.

2. A partial discharge charge quantity measurement method according to claim 1, wherein an algorithm for evaluating a discharge source, a discharge position, and a discharge state is incorporated to thereby allow for diagnosis regarding a discharge generation source, position determination, and insulation anomaly state.

3. A partial discharge charge quantity measurement device comprising:

an antenna adapted to measure an electromagnetic wave radiated from a device to be measured stemming from partial discharge and having sensitivity from at least the VHF band and mainly in the UHF band;

a filter for extracting a TEM mode component from a measured time waveform;

a measurement device body including a processing section adapted to obtain a second order integral value of the time waveform having undergone the filter processing and obtain a discharge charge quantity from the value; and an electromagnetic wave radiation simulating apparatus for inputting a pseudo discharge signal to the device to be measured and previously obtaining the relation between the second order integral value and the discharge charge quantity, wherein the processing section obtains the discharge charge quantity from the second order integral value with reference to the previously obtained relation between the second order integral value and the discharge charge quantity.

4. A partial discharge charge quantity measurement device according to claim 3, wherein an algorithm for evaluating a discharge source, a discharge position, and a discharge state is incorporated in the processing section so as to allow for diagnosis regarding a discharge generation source, position determination, and insulation anomaly state.

5. A partial discharge charge quantity measurement method comprising the steps of:

measuring an electromagnetic wave radiated from a device to be measured stemming from partial discharge, by use of an antenna having sensitivity from at least the VHF band and mainly in the UHF band;

extracting a TEM mode component from a measured time waveform by use of a filter;

obtaining a second order integral value of the time waveform having undergone the filter processing; and obtaining a discharge charge quantity from the obtained second order integral value, wherein the step of extracting a TEM mode component comprises extracting a frequency component equal to or lower than the cutoff frequency of the lowest-order electromagnetic wave propagation mode.

6. A partial discharge charge quantity measurement method comprising the steps of:

measuring an electromagnetic wave radiated from a device to be measured stemming from partial discharge, by use of an antenna having sensitivity from at least the VHF band and mainly in the UHF band;

extracting a TEM mode component from a measured time waveform by use of a filter;

obtaining a second order integral value of the time waveform having undergone the filter processing; and obtaining a discharge charge quantity from the obtained second order integral value, wherein a time range for performing the secondary integration is set to be equal to or longer than that of a time waveform of a current change of a discharge phenomenon which serves as a radiation electromagnetic wave source; and the second order integral value is the final value at the end the integration period, or a substantially constant second order integral value as measured after having first changed greatly within the integration period.

7. A partial discharge charge quantity measurement method comprising the steps of:

measuring an electromagnetic wave radiated from a device to be measured stemming from partial discharge, by use of an antenna having sensitivity from at least the VHF band and mainly in the UHF band;

extracting a TEM mode component from a measured time waveform by use of a filter;

obtaining a second order integral value of the time waveform having undergone the filter processing; and obtaining a discharge charge quantity from the obtained second order integral value, wherein a time range for performing the secondary integration is set to be equal to or longer than that of a time waveform of a current change of a discharge phenomenon which serves as a radiation electromagnetic wave source; and the second order integral value is the final value at the end the integration period, or a substantially constant second order integral value as measured after having first changed greatly within the integration period, wherein one of previously set typical time ranges corresponding to various typical discharges is selected as the integration period; and a discharge source is specified through observation of a change in the second order integral value within the selected time range.

8. A partial discharge charge quantity measurement method comprising the steps of:

measuring an electromagnetic wave radiated from a device to be measured stemming from partial discharge, by use of an antenna having sensitivity from at least the VHF band and mainly in the UHF band;

extracting a TEM mode component from a measured time waveform by use of a filter;

obtaining a second order integral value of the time waveform having undergone the filter processing; and obtaining a discharge charge quantity from the obtained second order integral value, wherein a calibration curve representing the relation between the second order integral value and the discharge charge quantity and obtained by use of an electromagnetic wave radiation simulating apparatus before actual operation is provided for each of various states; and when any one of the states is detected, the calibration curve corresponding to the detected state is used.

9. A partial discharge charge quantity measurement method comprising the steps of:

measuring an electromagnetic wave radiated from a device to be measured stemming from partial discharge, by use of an antenna having sensitivity from at least the VHF band and mainly in the UHF band;

extracting a TEM mode component from a measured time waveform by use of a filter;

obtaining a second order integral value of the time waveform having undergone the filter processing; and obtaining a discharge charge quantity from the obtained second order integral value, wherein the measured time waveform is subjected to time-frequency analysis performed through wavelet transformation; and when the influence of reflection waves is strong, the second order integral value is obtained after the reflection component is removed through filtering processing, whereby the discharge charge quantity is obtained, while the influence of the reflection waves is eliminated.

10. A partial discharge charge quantity measurement device comprising:

an antenna adapted to measure an electromagnetic wave radiated from a device to be measured stemming from partial discharge and having sensitivity from at least the VHF band and mainly in the UHF band;

a filter for extracting a TEM mode component from a measured time waveform; and a measurement device body including a processing section adapted to obtain a second order integral value of the time waveform having undergone the filter processing and obtain a discharge charge quantity from the value, wherein the filter for extracting a TEM mode component extracts a frequency component equal to or lower than the cutoff frequency of the lowest-order electromagnetic wave propagation mode.

11. A partial discharge charge quantity measurement device comprising:

an antenna adapted to measure an electromagnetic wave radiated from a device to be measured stemming from partial discharge and having sensitivity from at least the VHF band and mainly in the UHF band;

a filter for extracting a TEM mode component from a measured time waveform; and a measurement device body including a processing section adapted to obtain a second order integral value of the time waveform having undergone the filter processing and obtain a discharge charge quantity from the value, wherein a time range for performing the secondary integration is set to be equal to or longer than that of a time waveform of a current change of a discharge phenomenon which serves as a radiation electromagnetic wave source; and the second order integral value is the final value at the end the integration period, or a substantially constant second order integral value as measured after having first changed greatly within the integration period.

12. A partial discharge charge quantity measurement device comprising:

an antenna adapted to measure an electromagnetic wave radiated from a device to be measured stemming from partial discharge and having sensitivity from at least the VHF band and mainly in the UHF band;

a filter for extracting a TEM mode component from a measured time waveform; and a measurement device body including a processing section adapted to obtain a second order integral value of the time waveform having undergone the filter processing and obtain a discharge charge quantity from the value, wherein a time range for performing the secondary integration is set to be equal to or longer than that of a time waveform of a current change of a discharge phenomenon which serves as a radiation electromagnetic wave source; and the second order integral value is the final value at the end the integration period, or a substantially constant second order integral value as measured after having first changed greatly within the integration period, wherein one of previously set typical time ranges corresponding to various typical discharges is selected as the integration period; and a discharge source is specified through observation of a change in the second order integral value within the selected time range.

13. A partial discharge charge quantity measurement device comprising:

an antenna adapted to measure an electromagnetic wave radiated from a device to be measured stemming from partial discharge and having sensitivity from at least the VHF band and mainly in the UHF band;

a filter for extracting a TEM mode component from a measured time waveform; and a measurement device body including a processing section adapted to obtain a second order integral value of the time waveform having undergone the filter processing and obtain a discharge charge quantity from the value, wherein the processing section obtains, for each of various states, a calibration curve representing the relation between the second order integral value and the discharge charge quantity and obtained by use of an electromagnetic wave radiation simulating apparatus before actual operation; and when any one of the states is detected, the processing section uses the calibration curve corresponding to the detected state.

14. A partial discharge charge quantity measurement device comprising:

an antenna adapted to measure an electromagnetic wave radiated from a device to be measured stemming from partial discharge and having sensitivity from at least the VHF band and mainly in the UHF band;

a filter for extracting a TEM mode component from a measured time waveform; and a measurement device body including a processing section adapted to obtain a second order integral value of the time waveform having undergone the filter processing and obtain a discharge charge quantity from the value, wherein the measured time waveform is subjected to time-frequency analysis performed through wavelet transformation; and when the influence of reflection waves is strong, the second order integral value is obtained after the reflection component is removed through filtering processing, whereby the discharge charge quantity is obtained, while the influence of the reflection waves is eliminated.

15. A partial discharge charge quantity measurement device comprising:

an antenna adapted to measure an electromagnetic wave radiated from a device to be measured stemming from partial discharge and having sensitivity from at least the VHF band and mainly in the UHF band;

a filter for extracting a TEM mode component from a measured time waveform;

a measurement device body including a processing section adapted to obtain a second order integral value of the time waveform having undergone the filter processing and obtain a discharge charge quantity from the value; and an electromagnetic wave radiation simulating apparatus for inputting a pseudo discharge signal to the device to be measured and previously obtaining the relation between the second order integral value and the discharge charge quantity, wherein the processing section obtains the discharge charge quantity from the second order integral value with reference to the previously obtained relation between the second order integral value and the discharge charge quantity, wherein the electromagnetic wave radiation simulating apparatus is composed of an electromagnetic wave radiation antenna and an apparatus for generating a pseudo discharge signal in accordance with an arbitrarily set charge quantity, or composed of a discharge cell formed of a small sealed container and generating a real discharge, a discharge generation power supply for applying voltage thereto, and an apparatus which measures a discharge current within the discharge cell and obtains a charge quantity from its time integral value.

16. A partial discharge charge quantity measurement device comprising:

an antenna adapted to measure an electromagnetic wave radiated from a device to be measured stemming from partial discharge and having sensitivity from at least the VHF band and mainly in the UHF band;

a filter for extracting a TEM mode component from a measured time waveform;

a measurement device body including a processing section adapted to obtain a second order integral value of the time waveform having undergone the filter processing and obtain a discharge charge quantity from the value; and an electromagnetic wave radiation simulating apparatus for inputting a pseudo discharge signal to the device to be measured and previously obtaining the relation between the second order integral value and the discharge charge quantity, wherein the processing section obtains the discharge charge quantity from the second order integral value with reference to the previously obtained relation between the second order integral value and the discharge charge quantity, wherein the electromagnetic wave radiation simulating apparatus is composed of an electromagnetic wave radiation antenna and an apparatus for generating a pseudo discharge signal in accordance with an arbitrarily set charge quantity, or composed of a discharge cell formed of a small sealed container and generating a real discharge, a discharge generation power supply for applying voltage thereto, and an apparatus which measures a discharge current within the discharge cell and obtains a charge quantity from its time integral value, wherein an arbitrary gas is charged in the sealed container of the discharge cell; the discharge cell includes electrodes for creating a non-uniform electric field for simulating a partial discharge within the gas; and in the case where in-void discharge, surface discharge, or discharge from a free foreign object is simulated, a solid insulator including a void, a void-free solid insulator carrying a metal foreign object attached to a portion of the surface thereof, or a free foreign object is inserted between the electrodes so as to generate a partial discharge.

* * * * *